(12) United States Patent
Pavan et al.

(10) Patent No.: US 6,552,615 B1
(45) Date of Patent: Apr. 22, 2003

(54) METHOD AND SYSTEM FOR COMPENSATION OF LOW-FREQUENCY PHOTODIODE CURRENT IN A TRANSIMPEDANCE AMPLIFIER

(75) Inventors: Shanthi Pavan, Fremont, CA (US); Arvin Shahani, Mountain View, CA (US)

(73) Assignee: Big Bear Networks, Inc., Milpitas, CA (US)

( * ) Notice: Subject to any disclaimer, the term of this patent is extended or adjusted under 35 U.S.C. 154(b) by 0 days.

(21) Appl. No.: 09/944,692

(22) Filed: Aug. 31, 2001

(51) Int. Cl.[7] ................................................. H03F 1/36
(52) U.S. Cl. ....................................... 330/308; 330/110
(58) Field of Search .............................. 330/308, 110; 250/214 A; 327/307; 359/110, 193, 578

(56) References Cited

U.S. PATENT DOCUMENTS

| | | | | |
|---|---|---|---|---|
| 4,792,997 A | * | 12/1988 | Toussaint et al. | 330/59 |
| 5,295,161 A | * | 3/1994 | Dreps et al. | 327/563 |
| 5,612,810 A | * | 3/1997 | Inami et al. | 250/214 A |
| 5,777,507 A | * | 7/1998 | Kaminishi et al. | 327/100 |
| 5,875,049 A | * | 2/1999 | Asano et al. | 250/214 A |
| 6,084,478 A | * | 7/2000 | Mayampurath | 250/214 A |
| 6,141,169 A | * | 10/2000 | Pietruszynski et al. | 330/260 |
| 6,307,433 B1 | * | 10/2001 | Ikeda | 330/110 |

* cited by examiner

Primary Examiner—Timothy P. Callahan
Assistant Examiner—Linh Nguyen

(57) ABSTRACT

A method and system to compensate for DC and low frequency current produced by a photodiode that is illuminated with an optical data stream is described. An optical data stream ideally produces no current from a photodiode when the bit is a 0 and produces a current proportional to the optical power when the bit is a 1. Thus, the current produced from the photodiode consists of a DC component, which is typically half the current of a 1 bit (if there is an equal number of 1s and 0s in the data), and a high frequency component that carries the data. The DC component can interfere with the signal path's ability to process the information carrying component of the photodiode current, by causing a fixed offset to propagate and be amplified through it. This offset distorts the voltage signal at the output of the signal path, and must therefore be cancelled early in the path; usually in the first transimpedance stage or just after it. The technique described here performs this neutralization at the output of the first transimpedance amplifier stage.

23 Claims, 3 Drawing Sheets

300

Sense a DC offset voltage of a TIA by using a low bandwidth amplifier in a negative feedback loop.
310

Nullify the sensed DC offset voltage by using a correction voltage that is generated by passing the appropriate amount of current from the feedback loop through a series resistance located on the signal path following the TIA. (Note: the feedback loop begins and ends approximately at the differential outputs of the TIA.)
320

Limit the effect of the series resistance on the signal path at high frequencies by using a plurality of on-chip capacitors placed on the signal path to bypass the series resistance.
330

FIG. 3

METHOD AND SYSTEM FOR COMPENSATION OF LOW-FREQUENCY PHOTODIODE CURRENT IN A TRANSIMPEDANCE AMPLIFIER

FIELD OF THE INVENTION

The present invention relates to optical receivers, particularly to a transimpedance amplifier (TIA) within an optical receiver.

BACKGROUND

In optical receiver systems, a typical configuration employs a single photodiode to convert light signals into electrical current signals. The need to compensate for the photodiode's average output current arises to prevent a change in the quiescent bias point of subsequent electrical amplifiers. For example, if the single-ended photodiode feeds a differential amplifier, then the photodiode's average output current will cause an offset in the amplifier. In turn, this offset affects the switching point of subsequent circuits and could, for example, cause subsequent amplifiers to saturate.

To solve this problem, the average photodiode current must be sensed and then neutralized. A conventional solution involves sensing the offset voltage, due to the average photodiode current, at the output of a TIA. A feedback loop that monitors this voltage provides a low frequency current to the input of the TIA that cancels the photodiode's low frequency current. The drawback of this approach is that a large capacitor is required at the input of the TIA to suppress noise from the feedback loop. Introducing this large capacitance at the amplifier's input is problematic because it affects the signal path performance at high frequencies.

U.S. Pat. No. 4,792,997: This patent describes a technique to compensate for the "dark current" from a photodiode, or the current from the photodiode when no illumination is present. This is different than compensating for the DC current present when the photodiode is illuminated by an optical data stream. The technique uses a second photodiode that is not illuminated to accomplish the neutralization.

U.S. Pat. No. 5,295,161: This patent describes the conventional method for compensating the photodiode's low frequency current. The feedback loop is connected between the output of a differential transimpedance amplifier and one of the differential inputs.

U.S. Pat. No. 6,141,169: This patent describes a compensation loop that is also connected in the typical configuration, where a signal is sensed at the output of the amplifier and the compensating signal is fed in at the input of the amplifier. This particular implementation uses a digital feedback loop involving a comparator, loop filter, and charge pump.

Journal of Solid State Circuits, September 2000, "High-Gain Transimpedance Amplifier in InP-Based HBT Technology for the Receiver in 40 Gb/s Optical Fiber TDM Links," pp. 1260–1265: This paper describes a transimpedance amplifier that has a conventional feedback loop to compensate for the offset in the input signal current.

DISCLOSURE OF THE INVENTION

A transimpedance amplifier (TIA) is described. In one embodiment, the TIA includes an input coupled to a photodiode that is used to convert a light signal into an electrical signal to be provided to the TIA. The electrical signal includes a data component and a DC component. The TIA also includes a first differential output and a second differential output coupled to an RC circuit, a negative feedback loop, and an equivalent load RC circuit. The negative feedback loop is used to sense a DC offset voltage at approximately the first and second differential outputs. The feedback loop is used to nullify a sensed DC offset voltage at approximately the differential outputs by passing a current through the RC circuit to generate a correction voltage that subtracts from the DC offset voltage.

BRIEF DESCRIPTION OF THE FIGURES

The accompanying drawings which are incorporated in and form a part of this specification, illustrate embodiments of the invention and together with the description, serve to explain the principles of the invention:

FIG. 3 is a flow chart outlining steps for compensating for a low-frequency photodiode current in a TIA that is coupled to a photodiode in accordance with one embodiment of the invention.

DETAILED DESCRIPTION

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
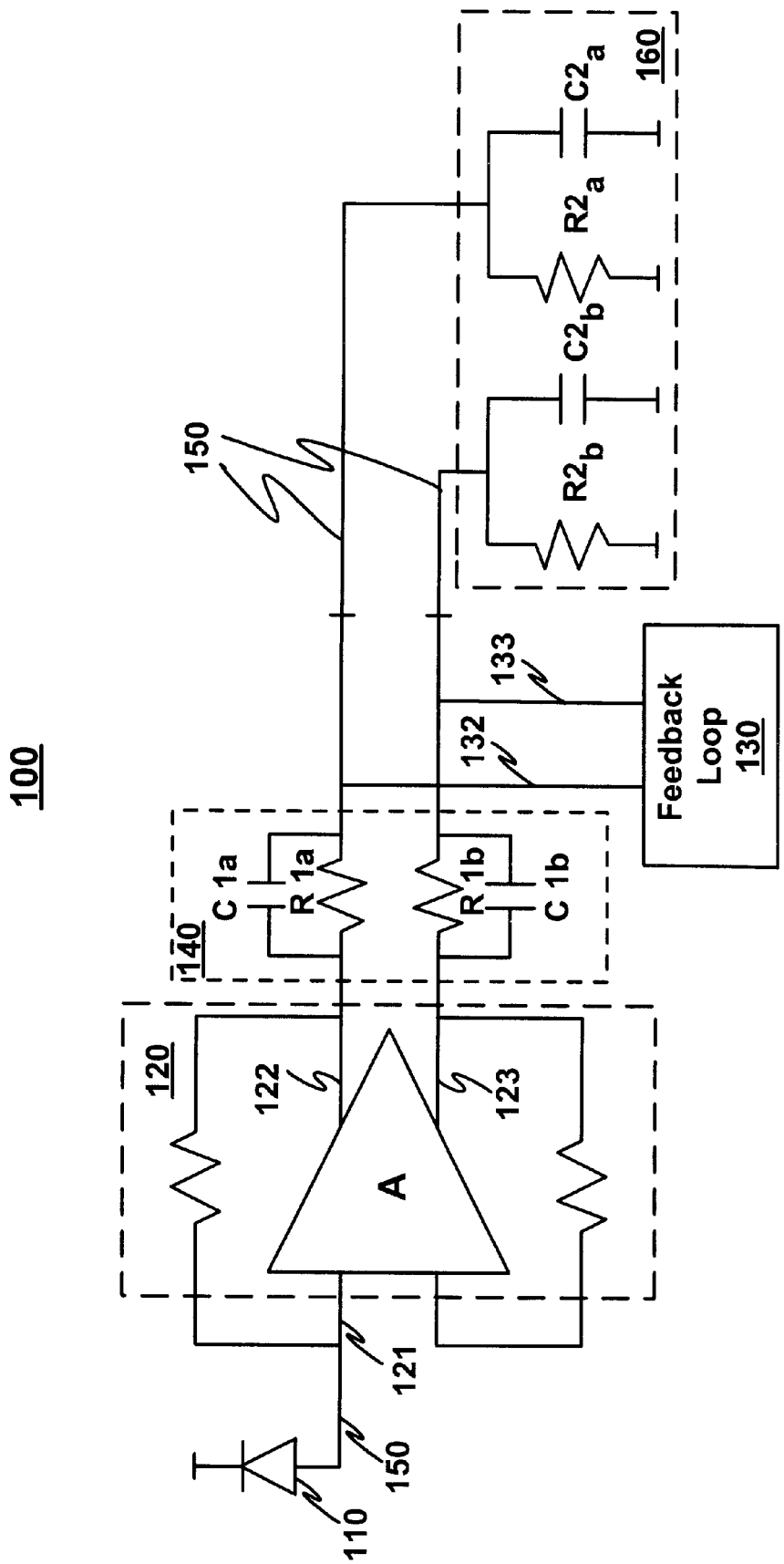
FIG. 1 shows a transimpedanace amplifier (TIA) for an optical receiver in accordance with one embodiment of the invention.

Referring now to FIG. 1, a transimpedance amplifier (TIA) 120 for an optical receiver 100 is shown in accordance with one embodiment of the invention.

Optical receiver 100 comprises a photodiode 110, TIA 120, a negative feedback loop 130, an RC circuit 140, an equivalent load RC circuit 160 and a signal path 150. Photodiode 110, TIA 120, RC circuit 140 and load RC circuit 160 are placed along signal path 150 in the listed order. RC circuit 140 comprises resistors (R1a and R1b) and capacitors (C1a and C1b). Load RC circuit 160 comprises resistors (R2a and R2b) and capacitors (C2a and C2b). It should be noted that load RC 160 can be entirely or partially due to the subsequent block's input impedance.

Through signal path 150, photodiode 110 is coupled to an input 121 of TIA 120. RC circuit 140 on signal path 150 is coupled to differential outputs 122–123 of TIA 120. Load RC on signal path 150 is coupled to RC circuit 140. Feedback loop 130 is coupled to signal path 150 on output side of TIA 120. Specifically, feedback loop 130 is coupled to signal path 150 approximately at RC circuit 140 via lines 132–133 as shown. As such, feedback loop 130 begins from a point on signal path 150 on output side of TIA 120;

moreover, feedback loop 130 ends approximately at the same point on signal path 150.

Photodiode 110 is adapted to convert a light signal into an electric current signal to be fed to TIA 120 through signal path 150. This electric current signal comprises a data component and a DC component. Problematically, the DC component interferes with the operation of signal path blocks following TIA 120. Specifically, the DC component is the average photodiode current that causes an offset voltage in TIA 120 and in subsequent blocks. TIA 120 is designed to tolerate this offset voltage, however this DC offset voltage affects the switching point of later blocks, and in the extreme can cause these blocks to saturate. As such, this DC offset voltage needs to be compensated.

To prevent the DC current component from interfering with the operation of blocks following TIA 120, negative feedback loop 130 is used to sense and then cancel an offset voltage produced by the low-frequency current. Specifically, feedback loop 130 is adapted to sense the DC offset voltage approximately at differential outputs 122–123 of TIA 120 on signal path 150. Moreover, because feedback loop 130 begins and ends at approximately the same point on signal path 150, feedback loop 130 is adapted to provide a correction current, which flows through resistors R1$a$ and R1$b$ to create a voltage that subtracts from the DC offset voltage at the differential outputs 122–123 of TIA 120. In so doing, feedback loop 130 nullifies the DC offset voltage by forcing the DC voltage at its input, the error voltage, to be small.

Referring still to FIG. 1, resistors R1$a$ and R1$b$ of RC circuit 140 are introduced into signal path 150 so that feedback loop 130 can pass the appropriate amount of current through R1$a$ and R1$b$ to nullify the DC offset voltage. Moreover, to limit the effect of RC circuit 140 on signal path 150 at high frequencies and to reduce noise from feedback loop 130, on-chip capacitors C1$a$ and C1$b$ are used to bypass R1$a$ and R1$b$. As such, capacitor C1$a$ is placed in parallel to resistor R1$a$; capacitor C1$b$ is placed in parallel to resistor R1$b$.

As understood herein, R1$a$ and R1$b$ have approximately the same resistance R1; C1$a$ and C1$b$ have approximately the same capacitance C1. R2$a$ and R2$b$ have approximately the same resistance R2; C2$a$ and C2$b$ have approximately the same capacitance C2.

The time constant of this parallel RC circuit 140 is matched to that of the equivalent load RC circuit 160 in signal path 150 to give a flat frequency domain response.

At mid-band frequencies, the attenuation in signal path 150, due to the introduction of R1$a$ and R1$b$, is $$\frac{R2}{R1+R2}.$$

Thus, to minimize attenuation it is desirable to have R2>>R1. At high frequencies, the attenuation in signal path 150 is due to a capacitive voltage divider and is $$\frac{C1}{C1+C2}.$$

Again, to minimize attenuation it is desirable to have C1>>C2. Setting these two attenuations equal to each other yields a flat frequency response from mid-band frequencies to high frequencies. As such, this equality of these two attenuations is met if the two time constants are equal. That is, $$R1*C1=R2*C2.$$

Examining the transfer function of the voltage divider due to the introduction of R1$a$, R1$b$, C1$a$ and C1$b$ in more detail shows that a pole and zero have been introduced into the signal path dynamics. The transfer function is $$\frac{R2(1+sR1C1)}{(R1+R2)\left(1+s\frac{R1R2}{R1+R2}(C1+C2)\right)},$$

which yields a pole at $$\frac{1}{2\pi\frac{R1R2}{R1+R2}(C1+C2)}$$

and a zero at $$\frac{1}{2\pi R1C1}.$$

Ideally, the pole and the zero should cancel each other, which occurs when R1*C1=R2*C2. However, if the conditions to minimize attenuation are met, R2>>R1 and C1>>C2, the location of the pole and zero will be very close even if the two time constants are not exactly equal. Thus, the sensitivity to variations in R2, which can depend for example on the beta of a bipolar transistor, is small.

Figure 2:
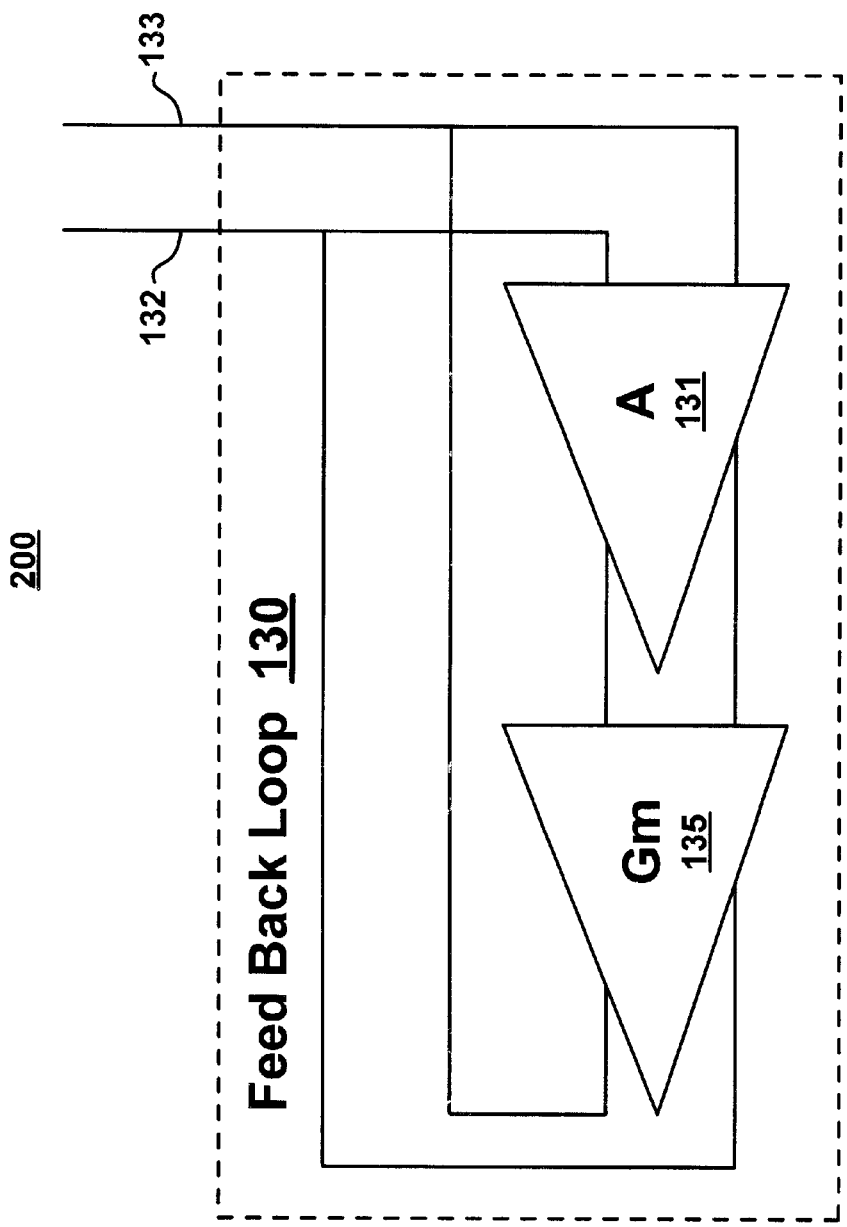
FIG. 2 shows a feedback loop for a TIA in accordance with one embodiment of the invention.

Referring now to FIG. 2 in view of FIG. 1, compensation negative feedback loop 130 is shown in more detail in accordance with one embodiment of the invention.

Feedback loop 130 comprises a low speed amplifier 131 and a voltage to current converter 135. Depending on the sign of amplifier 131, the couplings from the output of amplifier 131 to the input of converter 135 may need to be reversed to ensure that the loop operates in a negative feedback mode.

Differential outputs 122–123 of TIA 120 are coupled through RC circuit 140 to inputs 132–133 of amplifier 131. Amplifier 131 is adapted to amplify the error voltage, which is the result of subtracting the DC offset voltage at differential outputs 122–123 of TIA 120 from the neutralizing voltage across R1$a$ and R1$b$ in RC circuit 140. Converter 135 is adapted to convert the amplified error voltage from amplifier 131 into a current that is delivered through R1$a$ and R1$b$ to generate a correction voltage that nullifies the DC offset voltage.

Referring now to FIG. 3, a flow chart 300 is shown outlining steps for compensating for a low-frequency photodiode current in a TIA that is coupled to a photodiode in accordance with one embodiment of the invention.

In step 310, a DC offset voltage of the TIA is sensed by using a negative feedback loop that begins and ends approximately at differential outputs of the TIA. The negative feedback loop comprises an amplifier and a voltage to current converter coupled together. Specifically, the amplifier is adapted to amplify an error voltage at its input.

In step 320, a correction voltage, provided by using the feedback loop, is subtracted from said sensed DC offset voltage at said differential outputs of said TIA. The point of sensing is approximately the same as the point at which the feedback loop injects a neutralizing current that is converted into the correction voltage.

Furthermore in step 320, the sensed DC offset voltage is nullified by passing the appropriate amount of current from the feedback loop through a series resistance introduced into a signal path following the TIA. The series resistance comprises an RC circuit coupled to the TIA and a load RC circuit coupled to the RC circuit. Specifically, the voltage to current converter converts the amplified voltage into a current to be passed through a RC circuit to generate a correction voltage that is subtracted from the sensed DC offset voltage.

In step 330, the effect of the series resistance on the signal path at high frequencies is limited by using a plurality of on-chip capacitors placed on the signal path to bypass the series resistance, wherein the on-chip capacitors are adapted to bypass the series resistance for reducing noise from the feedback loop. The time constant of the parallel RC circuit is matched to the time constant of the load RC circuit in the signal path for providing a flat frequency domain response of the signal path.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A transimpedance amplifier (TIA) comprising:
   an input coupled to a photodiode that is used to convert a light signal into an electrical signal to be provided to said TIA, said electrical signal comprising a data component and a DC component; and
   a first differential output and a second differential output coupled to an RC circuit, a negative feedback loop, and an equivalent load RC circuit, wherein said negative feedback loop is used to sense a DC offset voltage at approximately said first and second differential outputs, and wherein said feedback loop is used to nullify a sensed DC offset voltage at approximately said differential outputs by passing a current through said RC circuit to generate a correction voltage that subtracts from said DC offset voltage.

2. The TIA of claim 1, wherein the time constant of said RC circuit is matched to the time constant of said load RC circuit to give a flat frequency domain response for said TIA.

3. The TIA of claim 1, wherein said negative feedback loop comprises:
   an amplifier used to amplify an error voltage; and
   a voltage to current converter used to convert said amplified error voltage into a current to be passed through said RC circuit to generate a correction voltage that when subtracted from said sensed DC offset voltage gives said error voltage.

4. The TIA of claim 1, wherein said RC circuit comprises:
   a first resistor and a first capacitor coupled in parallel to said first differential output of said TIA, wherein said RC circuit is used to filter noise from said feedback loop by using said first capacitor to bypass said first resistor; and
   a second resistor and a second capacitor coupled in parallel to said second differential output of said TIA, wherein said RC circuit is used to filter noise from said feedback loop by using said second capacitor to bypass said second resistor.

5. The TIA of claim 1, wherein said load RC circuit comprises:
   a third resistor and a third capacitor coupled in parallel to said RC circuit, wherein said load RC circuit is used to provide constant attenuation in a signal path of said TIA by using said third capacitor to bypass said third resistor; and
   a fourth resistor and a fourth capacitor coupled in parallel to said RC circuit, wherein said load RC circuit is used to provide constant attenuation in said signal path of said TIA by using said fourth capacitor to bypass said fourth resistor.

6. The TIA of claim 4, wherein said first and second capacitors of said RC circuit are on-chip capacitors.

7. The TIA of claim 5, wherein said third and fourth capacitors of said load RC circuit are on-chip capacitors.

8. An optical receiver comprising:
   a photodiode located on a signal path of said optical receiver, said photodiode used to convert a light signal into an electric signal that comprises a data component and a DC component;
   a transimpedance amplifier (TIA) located on said signal path following said photodiode, said TIA having its input coupled to an output of said photodiode to receive said electric signal;
   an RC circuit located on said signal path following said TIA, said RC circuit coupled to a first differential output and a second differential output of said TIA;
   a negative feedback loop coupled to said RC circuit on said signal path, said negative feedback loop used to sense a DC offset voltage at approximately said first and second differential outputs of said TIA, said negative feedback loop also used to reduced said DC offset voltage at approximately said first and second differential outputs of said TIA; and
   a load RC circuit located on said signal path following said RC circuit, wherein the time constant of said load RC circuit is approximately equal to the time constant of said RC circuit to give a flat frequency domain response to said signal path.

9. The optical receiver of claim 8, wherein said negative feedback loop comprises:
   an amplifier used to amplify an error voltage; and
   a voltage to current converter used to convert said amplified error voltage into a current to be passed through said RC circuit to generate a correction voltage that when subtracted from a sensed DC offset voltage gives said error voltage.

10. The optical receiver of claim 8, wherein said RC circuit comprises:
    a first resistor and a first capacitor coupled in parallel to said first differential output of said TIA, wherein said RC series is used to filter noise from said feedback loop by using said first capacitor to bypass said first resistor; and
    a second resistor and a second capacitor coupled in parallel to said second differential output of said TIA, wherein said RC circuit is used to filter noise from said feedback loop by using said second capacitor to bypass said second resistor.

11. The optical receiver of claim 8, wherein said load RC circuit comprises:
    a third resistor and a third capacitor coupled in parallel to said RC circuit, wherein said load RC circuit is used to provide constant attenuation in said signal path by using said third capacitor to bypass said third resistor; and a fourth resistor and a fourth capacitor coupled in parallel to said RC circuit, wherein said load RC circuit is used to provide constant attenuation in said signal path by using said fourth capacitor to bypass said fourth resistor.

12. The optical receiver of claim 10, wherein said first and second capacitors of said RC circuit are on-chip capacitors.

13. The optical receiver of claim 11, wherein said third and fourth capacitors of said load RC circuit are on-chip capacitors.

14. A system for compensation of photodiode current in a transimpedance amplifier (TIA) coupled to a photodiode, said system comprising:

a negative feedback loop used to sense a DC offset voltage at approximately differential outputs of said TIA, said feedback loop also used to provide a correction voltage that subtracts from said DC offset voltage at approximately said differential outputs of said TIA;

a series resistance on a signal path following said TIA, said series resistance used to allow said feedback loop to pass a current through said resistance to nullify said DC offset voltage;

an amplifier used to amplify an error voltage; and a voltage to current converter used to convert an amplified error voltage into a current to be passed through an RC circuit to generate a correction voltage that when subtracted from said DC offset voltage gives said error voltage.

15. The system of claim 14, comprising:

a plurality of on-chip capacitors used to bypass said series resistance, said plurality of on-chip capacitors also used to reduce noise from said feedback loop, wherein said plurality of on-chip capacitors and resistors from said series resistance form an RC circuit on said signal path.

16. The system of claim 15, wherein the time constant of said RC circuit is matched to that of a load RC circuit in a signal path to give a flat frequency domain response, wherein said on-chip capacitors are used to bypass said series resistance for reducing noise from said feedback loop.

17. The system of claim 15, wherein said RC circuit comprises:

a first resistor and a first capacitor coupled in parallel to a first differential output of said TIA, wherein said RC circuit is used to filter noise from said feedback loop by using said first capacitor to bypass said first resistor; and a second resistor and a second capacitor coupled in parallel to a second differential output of said TIA, wherein said RC circuit is used to filter noise from said feedback loop by using said second capacitor to bypass said second resistor.

18. The system of claim 15, wherein said load RC circuit comprises:

a third resistor and a third capacitor coupled in parallel to said RC circuit, wherein said load RC circuit is used to provide constant attenuation in said signal path by using said third capacitor to bypass said third resistor; and a fourth resistor and a fourth capacitor coupled in parallel to said RC circuit, wherein said load RC circuit is used to provide constant attenuation in said signal path by using said fourth capacitor to bypass said fourth resistor.

19. The system of claim 17, wherein said first and second capacitors of said RC circuit are on-chip capacitors.

20. The system of claim 18, wherein said third and fourth capacitors of said RC circuit are on-chip capacitors.

21. A method for compensation of photodiode current in a TIA coupled to a photodiode, said method comprising:

a) sensing a DC offset voltage of said TIA by using a negative feedback loop that begins and ends approximately at differential outputs of said TIA, wherein said negative feedback loop comprises an amplifier used to amplify an error voltage and a voltage to current converter used to convert said amplified voltage into a current to be passed through said RC circuit to generate a correction voltage that when subtracted from said sensed DC offset voltage gives said error voltage; and b) providing a correction voltage to said differential outputs of said TIA to subtract from a sensed DC voltage by using said feedback loop, wherein the point of sensing is approximately the same as the point at which said feedback loop injects a neutralizing current that is converted into said correction voltage.

22. The method of claim 21, wherein said step b) comprises the steps of:

nullifying said sensed DC offset voltage by passing an appropriate amount of current from said feedback loop through a series resistance introduced into a signal path following said TIA, said series resistance comprising a RC circuit coupled to said TIA and an equivalent load RC circuit coupled to said RC circuit; and limiting effect of said series resistance on said signal path by using a plurality of on-chip capacitors placed on said signal path to bypass said series resistance, wherein said on-chip capacitors are also used to bypass said series resistance for reducing noise from said feedback loop.

23. The method of claim 22, wherein the time constant of said RC circuit is matched to the time constant of a load RC circuit in said signal path for providing a flat frequency domain response of said signal path.

* * * * *